United States Patent [19]

Kumazawa et al.

[11] Patent Number: 5,463,635
[45] Date of Patent: Oct. 31, 1995

[54] SEMICONDUCTOR MEMORY DEVICE INCLUDING MEANS FOR CHECKING THE OPERATION OF AN INTERNAL ADDRESS GENERATOR

[75] Inventors: Ryoichi Kumazawa; Masaru Nawaki, both of Nara, Japan

[73] Assignee: Sharp Kabushiki Kaisha, Osaka, Japan

[21] Appl. No.: 234,600

[22] Filed: Apr. 28, 1994

Related U.S. Application Data

[63] Continuation of Ser. No. 711,544, Jun. 5, 1991, abandoned.

[30] Foreign Application Priority Data

Jun. 7, 1990 [JP] Japan .................................. 2-150838

[51] Int. Cl.$^6$ ........................... G06F 11/00; G06F 11/30; G11C 29/00
[52] U.S. Cl. ........................................ 371/21.1; 371/67.1
[58] Field of Search ............................... 371/21.1, 21.2, 371/21.3, 51.1, 51.2, 27, 67.1

[56] References Cited

U.S. PATENT DOCUMENTS

| | | | |
|---|---|---|---|
| 4,682,328 | 7/1987 | Ramsay et al. | 371/51.1 |
| 4,773,046 | 9/1988 | Akaogi et al. | 371/21.1 |
| 4,797,886 | 1/1989 | Imada | 371/27 |
| 5,119,380 | 6/1992 | Ohwada et al. | 371/57.2 |

FOREIGN PATENT DOCUMENTS

| | | | |
|---|---|---|---|
| 0398357 | 11/1990 | European Pat. Off. | 371/21.1 |
| 61-183702 | 8/1986 | Japan | 371/21.1 |
| 0619968 | 8/1978 | U.S.S.R. | 371/21.1 |
| 0618798 | 8/1978 | U.S.S.R. | 371/21.1 |

OTHER PUBLICATIONS

Alan Bentley, "Ram Tester Adapts to Memory Interface Requirements", Computer Design/Jun. 1979, pp. 124–136.
Rudy, "Memory Word Line Monitor", IBM Corp., 1976, p. 499.

Primary Examiner—Hoa T. Nguyen
Attorney, Agent, or Firm—Nixon & Vanderhye

[57] ABSTRACT

A data string representing the initial value (00000000) is supplied to an internal address generator. The internal address initial setting load signal is input to cause the internal address generator to be initialized. Then, a first detection signal is read out from the first detection circuit, and the level of the signal is checked. If the level of the first detection signal is HIGH, it indicates that the initialization of the internal address generator has been conducted normally. If the level of the first detection signal is LOW, it indicates that the initialization of the internal address generator has not been conducted normally. Thereafter, the count-up operation of the internal address generator is conducted while a count-up signal is supplied a predetermined number of times (255 times) to the internal address generator. A second detection signal is read out from a second detection circuit, and the level of the signal is checked. If the level of the second detection signal is HIGH, it indicates that the count-up operation of the internal address generator has normally been conducted. If the level of the second detection signal is LOW, it indicates that the count-up operation of the internal address generator has not been conducted normally.

17 Claims, 3 Drawing Sheets

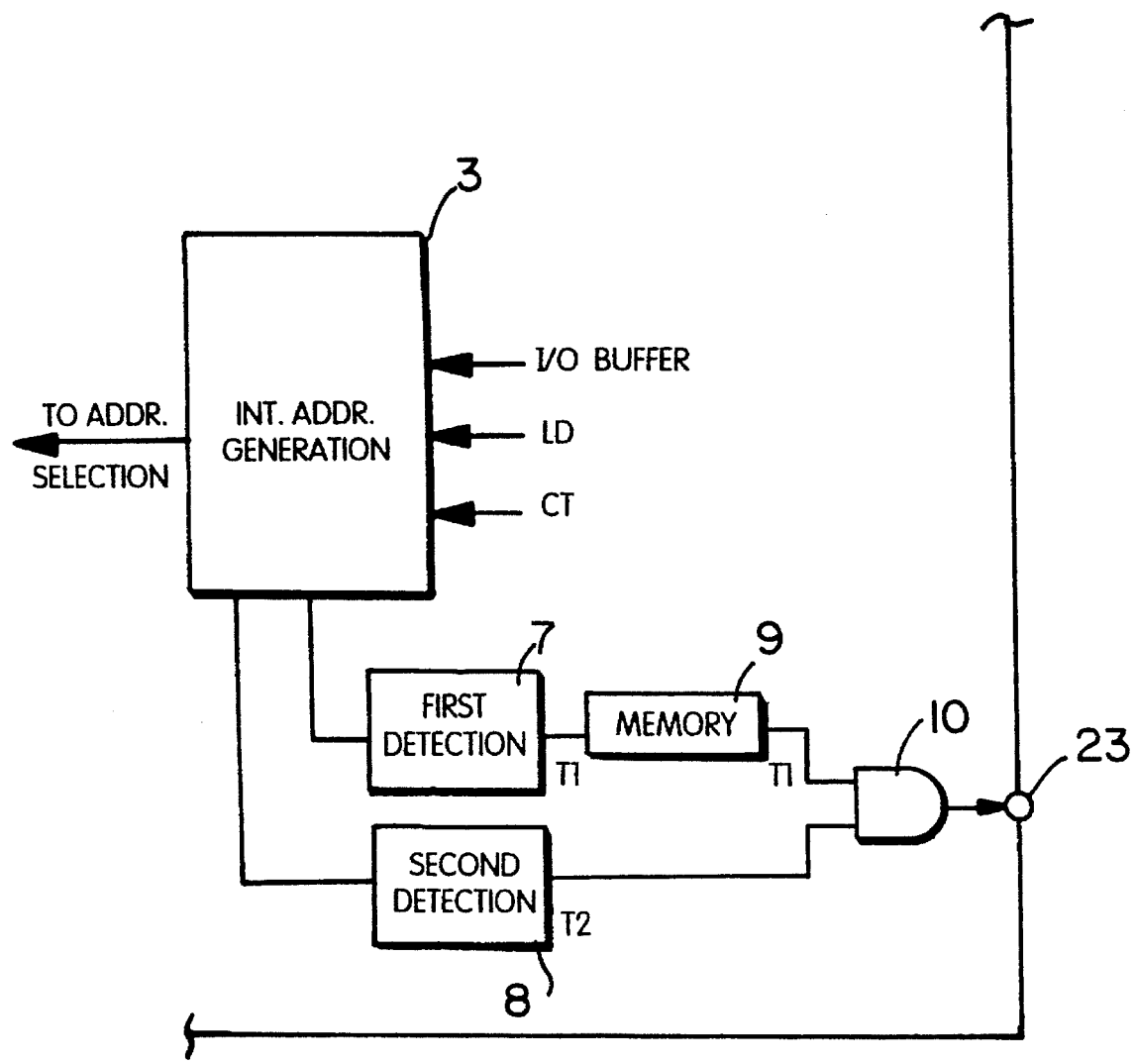

SEMICONDUCTOR MEMORY DEVICE INCLUDING MEANS FOR CHECKING THE OPERATION OF AN INTERNAL ADDRESS GENERATOR

This is a continuation of application Ser. No. 07/711,544, filed Jun. 5, 1991, now abandoned.

BACKGROUND OF THE INVENTION

1. Field of the Invention

This invention relates to a semiconductor memory device such as a dynamic random access memory device (DRAM) and static random access memory device (SRAM) which has an internal address generator incorporated therein.

2. Description of the Prior Art

Generally, a semiconductor memory device is provided with an internal address generator incorporated therein. In a final manufacturing stage of a semiconductor memory device or in a suitable occasion after a memory device has been installed in an electronic apparatus, it is usual to conduct a test to check whether or not such an internal address generator operates normally. Conventionally, such a test is performed as follows: First, certain data is written in every bit of a memory device using addresses generated by the internal address generator. Then the written in data is sequentially read out using external addresses. The read out data is compared with the data that is expected from the corresponding address (i.e., that certain data). If all the read out data agrees with the expected data, it is judged that the internal address generator operates normally.

The prior art involves a problem in that it requires a prolonged period of time to conduct the test. In the prior art, furthermore, even when disagreement between the read out data and the expected value is detected, it is incapable of determining whether the cause of this failure lies in the internal address generator or in other circuitry of the memory device.

SUMMARY OF THE INVENTION

The semiconductor memory device of this invention, which overcomes the above-discussed and numerous other disadvantages and deficiencies of the prior art, comprises an internal address generator which receives an initialization signal and a count signal, the output of said internal address generator being set to the initial value of said internal address generator when said initialization signal is received, the count operation of said internal address generator being controlled by said count signal, and further comprises: first detection means connected to the output of said internal address generator, and for, when said output of said internal address generator has a first predetermined value, generating a first detection signal; and second detection means connected to the output of said internal address generator, and for, when said output of said internal address generator has a second predetermined value, generating a second detection signal, said second predetermined value being greater than said first predetermined value.

In the above configuration, said first predetermined value may be the initial value of said output of said internal address generator, and said second predetermined value may be the maximum value of said output of said internal address generator.

Alternatively, said memory device may further comprise memory means for storing said first detection signal.

Alternatively, said memory device further comprises an AND gate to which an output of said memory means and said second detection signal are input.

Another semiconductor memory device according to the invention comprises an internal address generator which receives an initialization signal and a count signal, the output of said internal address generator being set to the initial value of said internal address generator when said initialization signal is received, the count operation of said internal address generator being controlled by said count signal, and further comprises detection means connected to the output of said internal address generator, and for, when said output of said internal address generator has a predetermined value, generating a detection signal.

In the above configuration, said predetermined value may be the initial value of said output of said internal address generator.

Thus, the invention described herein makes possible the objectives of:

(1) providing a semiconductor memory device in which a test procedure of checking the operation of an internal address generator can be rapidly conducted;

(2) providing a semiconductor memory device in which it is possible to detect with certain a failure in the operation of an internal address generator; and (3) providing a semiconductor memory device in which means for testing the operation of an internal address generator and with a simple structure are incorporated.

BRIEF DESCRIPTION OF THE DRAWINGS

This invention may be better understood and its numerous objects and advantages will become apparent to those skilled in the art by reference to the accompanying drawings as follows:

FIG. 3 is a block diagram illustrating another semiconductor memory device according to the invention.

DESCRIPTION OF THE PREFERRED EMBODIMENTS

Figure 1:
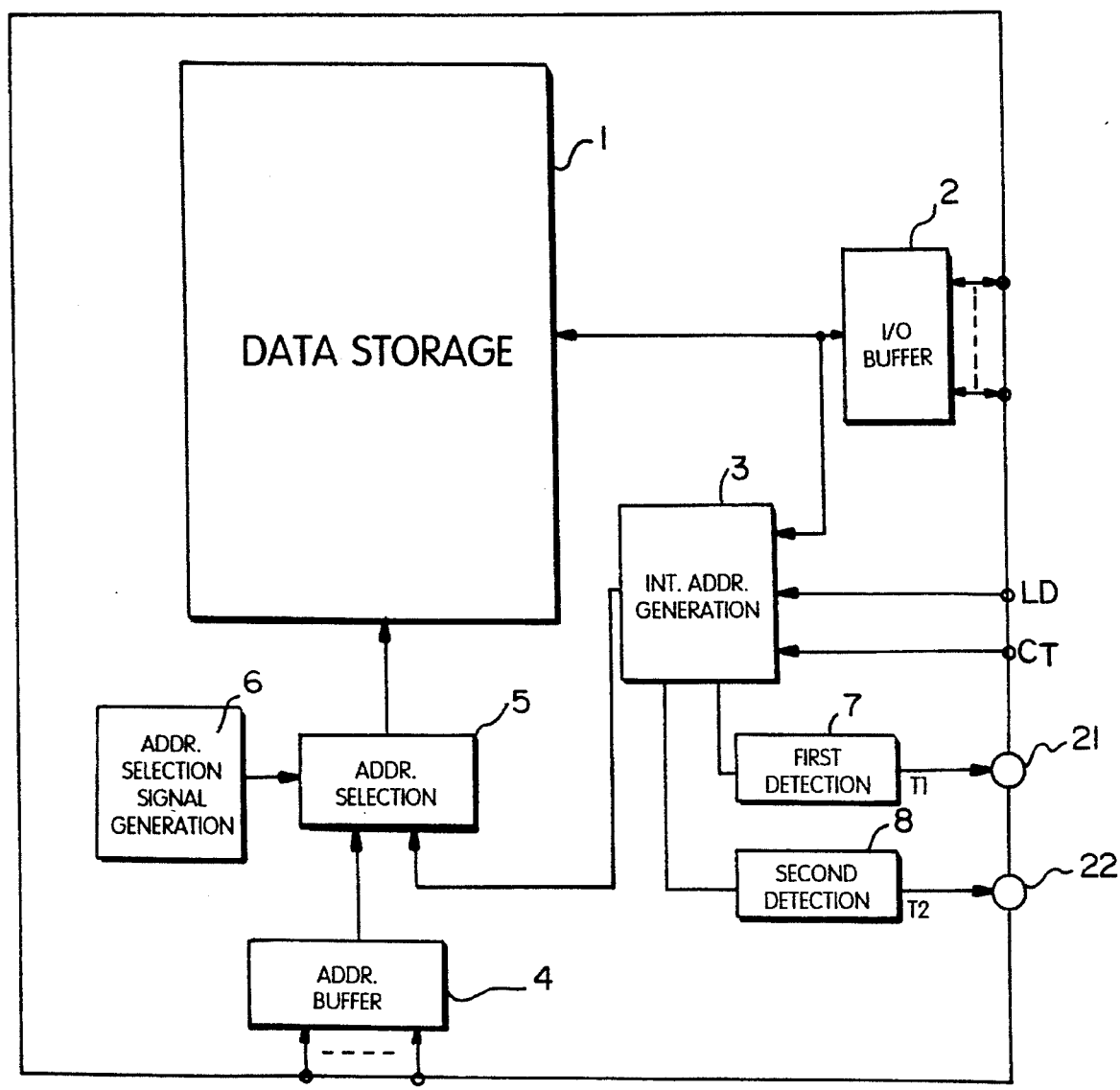
FIG. 1 is a block diagram illustrating a semiconductor memory device according to the invention.

FIG. 1 illustrates a semiconductor memory device according to the invention. The memory device of FIG. 1 comprises a data storage section 1, an I/O buffer 2 which is coupled to the data storage section 1, an internal address generator 3, an address buffer 4 which receives an address externally supplied, and an address selection circuit 5 which selects either of the outputs of the internal address generator 3 and address buffer 4 to be supplied to the data storage section 1. The address selection circuit 5 is controlled by an address selection signal output from an address selection signal generation circuit 6.

The output of the I/O buffer 2 is also coupled to the internal address generator 3 and data from the I/O buffer 2 is supplied to the internal address generator 3 so that the data is taken in as an initial value of the internal address in response to an internal address initial setting load signal LD. The internal address generator 3 receives also a count-up signal CT for the internal address. Each time the count-up signal CT is input to the internal address generator 3, the internal address is incremented by one.

The memory device of FIG. 1 further comprises a first detection circuit 7, and a second detection circuit 8. When the ouptut of the internal address generator 3 is a first predetermined value (in this embodiment, the initial value of the internal address generator 3 (i.e., all bits are zero)), the first detection circuit 7 output a first detection signal T1. When the output of the internal address generator 3 is a second predetermined value (in this embodiment, the maximum value of the internal address generator 3 (i.e., all bits are one)), the second detection circuit 8 outputs a second detection signal TZ.

Figure 2:
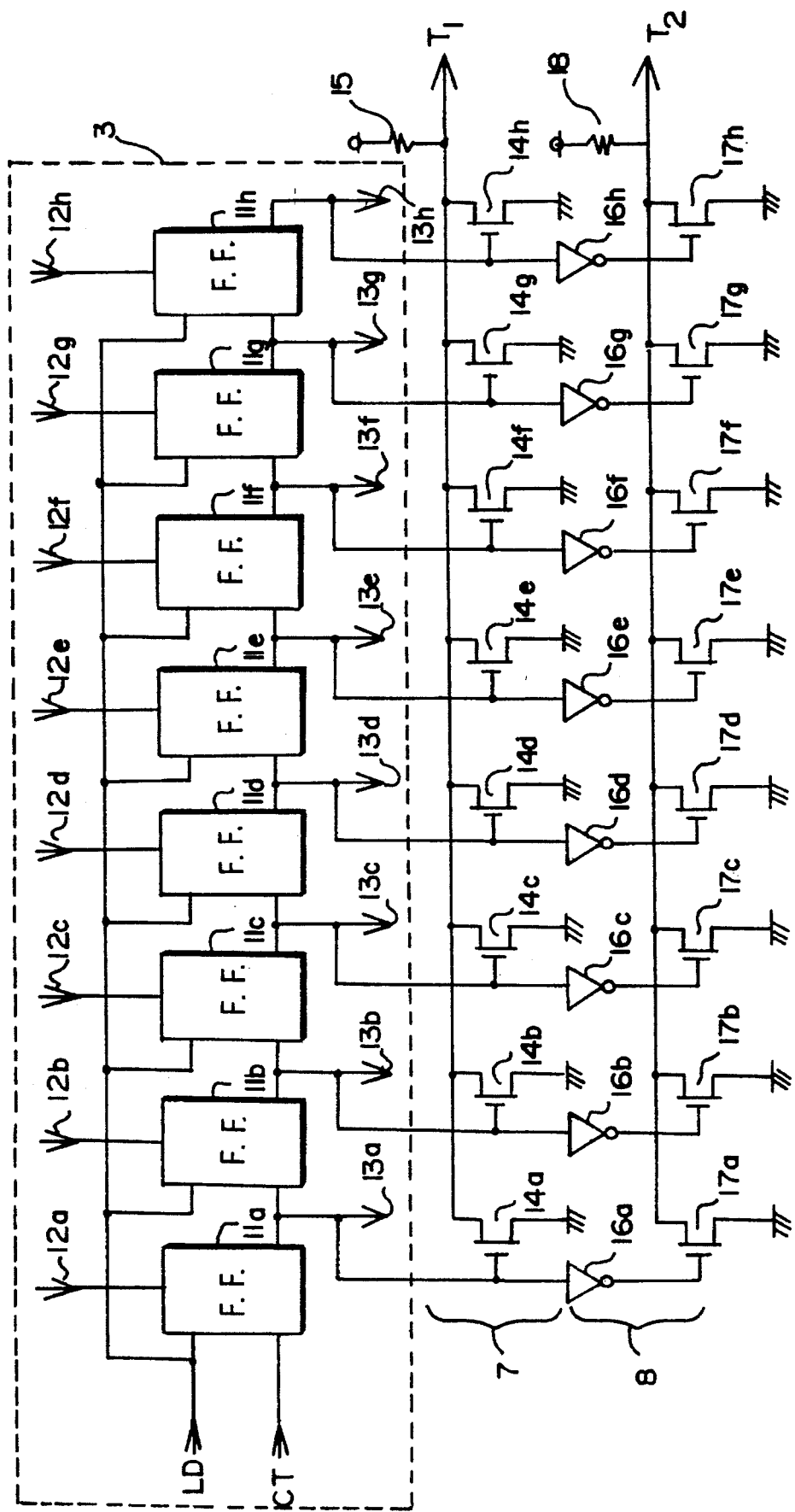
FIG. 2 is a circuit diagram illustrating an internal address generator, and first and second detection circuits used in the embodiment of FIG. 1.

FIG. 2 illustrates the internal address generator 3, and first and second detection circuit 7 and 8. The internal address generator 3 comprises eight flip-flops $11_a$–$11_h$ which are connected in series to form an 8-bit binary counter. Data from the I/O buffer 2 are supplied to the flip-flops $11_a$–$11_h$ through eight input terminals $12_a$–$12_h$, and taken into the flip-flops $11_a$–$11_h$ in response to the internal address initial setting load signal LD. The output of the binary counter is supplied as an 8-bit internal address to the address selection circuit 5 via eight output terminals $13_a$–$13_h$, and also to the first and second detection circuits 7 and 8. The count-up signal CT is input to the first flip-flop $11_a$. The output of the flip-flop $11_a$ is inverted at the falling edge of the count-up signal CT. Similarly, the outputs of the following flip-flops $11_b$–$11_h$ which respectively receive the output of the preceding flip-flops $11_a$–$11_g$ are inverted at the falling edge of the outputs of the preceding flip-flops $11_a$–$11_g$.

The first detection circuit 7 comprises eight N-channel MOS transistors $14_a$–$14_h$ which are connected in parallel, and a pull-up resistor 15. The output terminals $13_a$–$13_h$ of the internal address generator 3 are connected to the gates of the transistors $14_a$–$14_h$, respectively. The output (first detection signal) T1 of the detection circuit 7 is HIGH only when the output of the internal address generator 3 represents the initial value (00000000) of the binary counter (i.e., when all the levels of the output terminals $13_a$–$13_h$ are LOW), and is LOW when the output is not the initial value.

The second detection circuit 8 comprises eight inverters $16_a$–$16_h$, eight N-channel MOS transistors $17_a$–$17_h$ which are connected in parallel, and a pull-up a resistor 18. The output terminals $13_a$–$13_h$ of the internal address generator 3 are connected to the gates of the transistors $17_a$–$17_h$ through the inverters $16_a$–$16_h$, respectively. The output (second detection signal) T2 of the detection circuit 8 is HIGH only when the output of the internal address generator 3 represents the maximum value (11111111) of the binary counter (i.e., when all the levels of the output terminals $13_a$–$13_h$ are HIGH), and is LOW when the output is not the maximum value. The first and second detection signals T1 and T2 are output through output terminals 21 and 22, respectively.

The procedure of checking the operation of the internal address generator 3 will be described. Data representing the initial value (00000000) are supplied to the input terminals $12_a$–$12_h$ of the internal address generator 3 through the I/O buffer 2. The internal address initial setting load signal LD is input to cause the internal address generator 3 to be initialized. Then, the first detection signal T1 is read out from the first detection circuit 7, and the level of the signal is checked. If the level of the first detection signal T1 is HIGH, it is judged that the initialization of the internal address generator 3 has been conducted normally. If the level of the first detection signal T1 is LOW, it indicates that the initialization of the internal address generator 3 has not been conducted normally.

Thereafter, the count-up operation of the internal address generator 3 is conducted while the count-up signal CT is supplied a predetermined number of times (in this embodiment, 255 times) to the internal address generator 3. The second detection signal T2 is read out from the second detection circuit 8, and the level of the signal is checked. If the level of the second detection signal T2 is HIGH, it indicates that the count-up operation of the internal address generator 3 has been conducted normally. If the level of the second detection signal T2 is LOW, it means that the count-up operation of the internal address generator 3 has not been conducted normally.

According to the embodiment, it can be judged whether or not the internal address generator 3 operated normally, simply by checking the levels of the first and second detection signals T1 and T2. Therefore, a test procedure of checking the operation of the internal address generator 3 can be rapidly and surely performed.

The configuration of the detection circuits is not restricted to the one described above. The first and second predetermined values may correspond to numbers other than those mentioned above.

FIG. 3 illustrates another embodiment of the invention. In this embodiment, the first detection signal T1 is fetched from the first detection circuit 7 at an appropriate timing after the initialization, and stored into a memory unit 9. The output of the memory unit 9 and the second detection signal T2 from the second detection circuit 8 are input to an AND gate 10, the output of which is connected to an output terminal 23. According to this embodiment, it can be judged whether or not the internal address generator 3 normally operates, by checking only the level of the output terminal 23, thereby reducing the number of output terminals of the semiconductor memory device.

In a further embodiment, the second detection circuit 8 is not provided, and the other configuration is the same as that shown in FIG. 1. In this modified embodiment, the procedure of checking the operation of the internal address generator 3 is performed as follows: First, the first detection signal T1 is produced and checked in the same manner as described with reference to FIG. 2, to confirm the proper initialization. Then, the count-up signal CT is supplied one or more times (less than 255 times) to the internal address generator 3, and the first detection signal T1 is read out. If the level of the first detection signal T1 remains HIGH, it is judged that the count-up operation of the internal address generator 3 has not been conducted normally. If the first detection signal T1 has turned into a low level, it means that the count-up operation has been done. Thereafter, the count-up signal CT is continued to be supplied 256 times in total to the internal address generator 3. The first detection signal T1 is read out for the third time. If the level of the first detection signal T1 is HIGH, it indicates that the count-up operation of the internal address generator 3 has been conducted normally. If the level of the first detection signal T1 is LOW, it indicates that the count-up operation of the internal address generator 3 has not been conducted normally.

According to the invention, it is possible to easily check the operation of the internal address generator in a short period of time without writing or reading data from the data storage section.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor memory device, comprising:

a memory;

internal address means for providing internal addresses to the memory, said internal address means changing an internal counting value representing one of said internal addresses in response to a count signal, setting said internal counting value to an initial value in response to an initialization signal and outputting a signal representing the internal counting value, wherein each of said internal addresses is provided based on the internal counting value; and detection means for judging whether said internal address means operates normally or not using a first predetermined counting value and a second predetermined counting value, said detection means including:

first detection means connected to the output of said internal address means, said first detection means detecting whether or not said output signal of said internal address means is said first predetermined counting value, and generating a first detection signal indicating a result of the detection, said first detection means including a plurality of MOS transistors which are connected in parallel, and a resistor; and second detection means connected to the output of said internal address means, said second detection means detecting whether or not said output signal of said internal address means is said second predetermined counting value, and generating a second detection signal indicating a result of the detection, said second predetermined counting value being greater than said first predetermined counting value.

2. A semiconductor memory device according to claim 1, wherein said first predetermined counting value is the initial value of said internal counting value of said internal address means.

3. A semiconductor memory device according to claim 2, wherein said first detection means generates the first detection signal only when the output is the initial value of the internal address means.

4. A semiconductor memory device according to claim 1, wherein said second predetermined counting value is the maximum value of said internal counting value of said internal address means.

5. A semiconductor memory device according to claim 4, wherein said second detection means generates the second detection signal only when the output signal of the internal address means is the maximum value of the internal counting value of the internal address means.

6. A semiconductor memory device according to claim 1, wherein said memory device further comprises memory means for storing said first detection signal.

7. A semiconductor memory device according to claim 6, wherein said memory device further comprises checking means to which an output signal of said memory means and said second detection signal are input, said checking means generating a checking signal indicating whether a level of said output signal of said memory means and a level of said second detection signal are both greater than a predetermined level or not.

8. A semiconductor memory device according to claim 7, wherein said checking means is an AND gate.

9. A semiconductor memory device according to claim 1, wherein said internal address means comprises a plurality of flip-flops which are connected in series.

10. A semiconductor memory device according to claim 9, wherein said plurality of flip-flops forms a plural-bit binary counter, said first predetermined counting value is the initial value of the plural-bit binary counter with all of the plural-bits being zero, and said second predetermined counting value is a maximum value of the plural-bit binary counter with all of the plural-bits being one.

11. A semiconductor memory device according to claim 1, wherein said first and second detection means comprise wired OR respectively.

12. A semiconductor memory device according to claim 1, wherein said second detection means comprises a plurality of inverters, a plurality of MOS transistors which are connected in parallel, and a resistor.

13. A semiconductor memory device, comprising:

a memory;

internal address means for providing internal addresses to the memory, said internal address means changing an internal counting value representing one of said internal addresses in response to a count signal, setting said internal counting value to an initial value in response to an initialization signal and outputting a signal representing the internal counting value, wherein each of said internal addresses is provided based on the internal counting value; and detection means for judging whether said internal address means operates normally or not using a first predetermined counting value and a second predetermined counting value, said detection means including:

first detection means connected to the output of said internal address means, said first detection means detecting whether or not said output signal of said internal address means is said first predetermined counting value, and generating a first detection signal indicating a result of the detection;

second detection means connected to the output of said internal address means, said second detection means detecting whether or not said output signal of said internal address means is said second predetermined counting value, and generating a second detection signal indicating a result of the detection, said second predetermined counting value being greater than said first predetermined counting value;

memory means for storing said first detection signal; and checking means to which an output signal of said memory means and said second detection signal are input, said checking means generating a checking signal indicating whether or not a level of said output signal of said memory means and a level of said second detection signal are both greater than a predetermined level.

14. A semiconductor memory device according to claim 13, wherein said checking means is an AND gate.

15. A semiconductor memory device according to claim 13, wherein said internal address means comprises a plurality of flip-flops which are connected in series.

16. A semiconductor memory device according to claim 15, wherein said plurality of flip-flops forms a plural-bit binary counter, said first predetermined counting value is the initial value of the plural-bit binary counter with all of the plural-bits being zero, and said second predetermined counting value is the maximum value of the plural-bit binary counter with all of the plural-bits being one.

17. A semiconductor memory device according to claim 13, wherein said first and second detection means comprise wired OR respectively.

* * * * *